(12) United States Patent
Chi et al.

(10) Patent No.: US 9,076,791 B1
(45) Date of Patent: Jul. 7, 2015

(54) MOS TRANSISTOR OPERATED AS OTP CELL WITH GATE DIELECTRIC OPERATING AS AN E-FUSE ELEMENT

(71) Applicant: GLOBAL FOUNDRIES Inc., Grand Cayman (KY)

(72) Inventors: Min-hwa Chi, Malta, NY (US); Yanxiang Liu, Glenville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 17 days.

(21) Appl. No.: 14/156,018

(22) Filed: Jan. 15, 2014

(51) Int. Cl.
H01L 23/525 (2006.01)
(52) U.S. Cl.
CPC .................. H01L 23/5252 (2013.01)
(58) Field of Classification Search
CPC ................................... H01L 23/5252
USPC .................. 257/530; 438/467, 600
See application file for complete search history.

(56) References Cited

U.S. PATENT DOCUMENTS

2012/0327700 A1* 12/2012 Li ................................. 365/104

OTHER PUBLICATIONS

J. Peng et al. "A Novel Embedded OTP NVM Using Standard Foundry CMOS Logic Technology" 2006 IEEE, pp. 1-3.
Maybe Chen et al. "A New Antifuse Cell With Programmable Contact for Advance CMOS Logic Circuits", IEEE Electron Device Letters, vol. 29, No. 5, May 2008, pp. 522-524.
Y.S. Chen et al. "Highly Scalable Hafnium Oxide Memory With Improvements of Resistive Distribution and Read Disturb Immunity", 2009 IEEE, pp. IEDM09-105-IEDM09-108.
H. Shang et al. "High Performance Bulk Planar 20NN CMOS Technology for Low Power Mobile Applications", 2012 Symposium on VLSI Technology Digest of Technical Papers, 2012 IEEE, pp. 129-130.
J. McPherson et al. "Proposed Universal Relationship Between Dielectric Breakdown and Dielectric Constant" , Texas Instrument, Silicon Technology Development, 2002 IEEE, pp. IEDM633-IEDM-636.

* cited by examiner

Primary Examiner — Daniel Shook
(74) Attorney, Agent, or Firm — Ditthavong & Steiner, P.C.

(57) ABSTRACT

A process and device are provided for a high-k gate-dielectric operating as a built-in e-fuse. Embodiments include: providing first and second active regions of a transistor, separated by a gate region of the transistor, on a substrate; forming an interfacial layer on the gate region; minimizing the interfacial layer; forming a high-k gate dielectric layer on the interfacial layer to operate as an e-fuse element, the high-k gate dielectric layer and interfacial layer having a combined breakdown voltage less than three times a circuit operating voltage associated with the transistor; and forming a metal gate on the high-k gate dielectric layer.

20 Claims, 7 Drawing Sheets

200

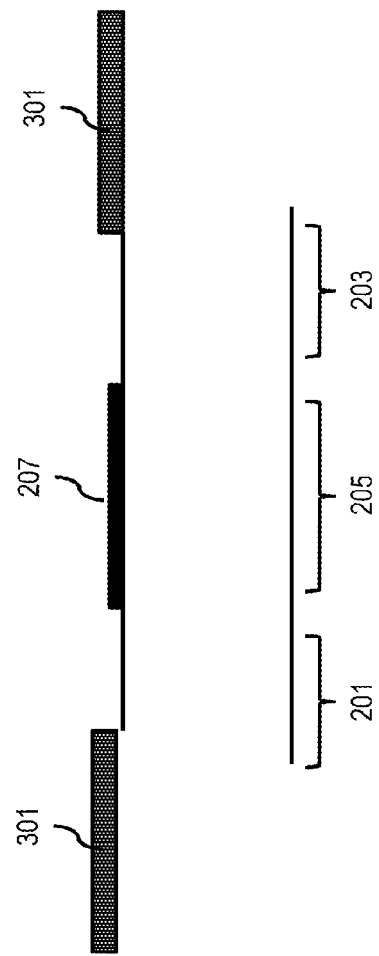

200

500

US 9,076,791 B1

MOS TRANSISTOR OPERATED AS OTP CELL WITH GATE DIELECTRIC OPERATING AS AN E-FUSE ELEMENT

TECHNICAL FIELD

The present disclosure relates to a manufacture of semiconductor devices, such as integrated circuits (ICs). The present disclosure is particularly applicable to improving a density of features (e.g., cell utilization) and simplifying a programming of an e-fuse element in an IC.

BACKGROUND

In a fabrication of semiconductor devices, IC designs and resulting devices may need an e-fuse to allow programming (e.g., "blow a fuse") for digital information storage in a resulting IC. Typical e-fuse structures include a 2-terminal resistor using doped polysilicon in gate first high-k metal gate (HKMG) fabrication methods or silicide or thin metal for gate last HKMG processes for advanced complementary metal-oxide semiconductor (CMOS) nodes at the 28 nm technology node or beyond. However, processes to fabricate and program a 2-terminal resistor e-fuse typically require an extra mask, resulting in extra complexity and expense. Moreover, the size of 2-terminal resistors in an IC may be greater than an order of magnitude larger in size relative to CMOS transistors of the IC design. As such, adding a 2-terminal resistor array in CMOS circuit requires a large Si area and reduces a density of features of an IC design. Further, the operating voltage/current to blow or program the e-fuse is often large (~5×) compared to a typical logic circuit operating voltage (Vcc) (e.g. Vcc~1v to 1.2v at 28 nm CMOS node). Thus, an e-fuse with a select transistor (for selecting a specific e-fuse to be blown or programmed) can form a one-time programming (OTP) cell with programming that requires either an external high voltage source or a charge pump circuit to generate, on-chip, a higher voltage than Vcc.

A need therefore exists for methodology compatible with CMOS flow enabling fabrication of a smaller e-fuse and OTP with a low programming voltage/current, and the resulting device.

SUMMARY

An aspect of the present disclosure is a method of forming, inter alia, a high-k gate dielectric layer on a minimized interfacial layer to operate as an e-fuse element.

Another aspect of the present disclosure is a device (e.g., metal-oxide-semiconductor field-effect transistor (MOSFET)) operating as an OTP cell having, inter alia, a high-k gate dielectric layer on a minimized interfacial layer configured to operate as a built-in e-fuse element.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing first and second active regions of a transistor, separated by a gate region of the transistor, on a substrate; forming an interfacial layer on the gate region; minimizing the interfacial layer; forming a high-k gate dielectric layer on the interfacial layer to operate as an e-fuse element, the high-k gate dielectric layer and interfacial layer having a combined breakdown voltage less than three times (e.g., 2×-3×) of a (logic) circuit operating voltage (e.g., Vcc); and forming a metal gate on the high-k gate dielectric layer.

Aspects include a method including minimizing the interfacial layer by removing, prior to forming the high-k gate dielectric layer, at least a portion of the interfacial layer. Some aspects include minimizing the interfacial layer to a thickness of less than 0.5 nanometers (nm). Further aspects include minimizing the interfacial layer by implanting nitrogen (N) on the (surface of the) gate region of the substrate. Additional aspects include forming the high-k gate dielectric layer of hafnium oxide ($HfO_2$) and to a thickness of between 1.5 nm and 2.5 nm. Some aspects include: forming a dummy gate; forming spacers around the dummy gate; forming an interlayer dielectric (ILD) around the spacers; and removing the dummy gate, prior to minimizing the interfacial layer. Further aspects include: initiating a programming operation (e.g., breakdown) in the high-k gate dielectric (and interfacial) layer by selectively providing the programming voltage across the gate (e.g., metal gate electrode) and first active regions (i.e. channel region) and the gate and second active regions; and terminating the programming voltage after sufficient breakdown of the high-k gate dielectric (and interfacial) layer, wherein sufficient breakdown of the high-k gate dielectric enables a low resistive (e.g., $10^{-7} \rho(\Omega \cdot m)$) path (or short) between the gate (e.g., channel) region of the substrate and the metal gate. Additional aspects include determining whether the transistor is "programmed" by providing a reading voltage on the gate and across the first (e.g., drain) and second (e.g., source) active regions (e.g., a large drain current represents the gate dielectric e-fuse is blown), the reading voltage being less than the (logic) circuit operation voltage (e.g., Vcc). Some aspects include: providing first and second active regions of a second transistor, separated by a gate region of the second transistor, on the substrate; and forming a second high-k gate dielectric layer and a second interfacial layer in the gate region of the second transistor, the second high-k gate dielectric and the second interfacial layers having a combined breakdown voltage greater than the combined breakdown voltage of the first transistor. The second transistor is intended for logic circuit, and the first transistor is designed for OTP cell.

Another aspect of the present disclosure is a device including: a substrate; first and second active regions of a transistor, separated by a gate region of the transistor, on the substrate; an interfacial layer on the gate region having a thickness of less than 0.5 nm; a high-k gate dielectric layer on the interfacial layer configured to operate as an e-fuse element, the high-k gate dielectric layer and interfacial layers having a combined breakdown voltage less than three times (e.g., 2×-3× of) a circuit operating voltage (e.g., Vcc) associated with the transistor; and a metal gate (e.g., electrode) on the high-k gate dielectric layer.

Some aspects include a device, wherein an interfacial layer includes silicon dioxide ($SiO_2$). Additional aspects include N implanted on the (surface of) gate region of the substrate. Further aspects include a device, wherein a high-k gate dielectric layer includes $HfO_2$. Some aspects include a device, wherein a high-k gate dielectric layer has a thickness of between 1.5 nm and 2.5 nm. Additional aspects include a device, wherein a breakdown voltage is (designed as) greater than two times a circuit operating voltage (e.g., Vcc) (e.g. ~2.5 volts (V)), and the logic circuit operating voltage Vcc is between 1v to 1.2v (at the 28 nm technology node and beyond). Further aspects include: first and second active regions of a second transistor, separated by a gate region of the second transistor, on the substrate; and a second high-k gate dielectric and a second interfacial layer in the gate region of the second transistor, the second high-k gate dielectric layer having a breakdown voltage greater than the combined breakdown voltage of the first transistor. Some aspects include a second high-k gate dielectric layer having a breakdown voltage between 5 V and 10 V and including a $SiO_2$ interfacial layer having a thickness of between 1 nm and 2 nm. The thicker interfacial layer can result in high reliability of the second transistor, which is designed for high performance and high speed logic circuit operation.

Another aspect of the present disclosure is a method including: providing first and second active regions of a transistor, separated by a gate region of the transistor, on a substrate; forming a $SiO_2$ layer having a thickness of greater than 0.5 nm on the gate region; forming a dummy gate on the $SiO_2$ layer; forming spacers around the dummy gate; forming an ILD around the spacers; removing the dummy gate, exposing the $SiO_2$ layer; reducing the $SiO_2$ layer to a thickness of less than 0.5 nm; implanting N on the (surface of the) gate region of the substrate; forming a high-k gate dielectric layer on the reduced $SiO_2$ layer to operate as an e-fuse element, the high-k gate dielectric layer including $HfO_2$ and having a thickness of between 1.5 nm and 2 nm, wherein the high-k gate dielectric layer and (thin) $SiO_2$ layer have a combined breakdown voltage of less than three times (e.g., 2×-3× of) a circuit operating voltage (e.g., Vcc) associated with the transistor; and forming a metal gate on the high-k gate dielectric layer.

Some aspects include: initiating a programming operation in the high-k gate dielectric layer by selectively providing the programming voltage (e.g., Vpp) across the gate and first active regions and the gate and second active regions; terminating the programming voltage after sufficient breakdown of the high-k gate dielectric layer, wherein sufficient breakdown of the high-k gate dielectric enables a low resistive (e.g., $10^{-7}$ ρ(Ω·m)) path (or short) between the gate (e.g., channel) region of the substrate and the metal gate; and determining whether the transistor is "programmed" by providing a reading voltage (e.g., Vd) on the gate (electrode) and across the first and second active regions (e.g., source and drain regions), where, for instance, a large drain current represents the gate dielectric e-fuse is blown. The reading voltage (e.g., Vd) is less than the operating voltage (e.g., ½ Vcc). Additional aspects include a method, wherein a first breakdown voltage is about 2.5 V and the circuit operating voltage (e.g., Vcc) is between 1 V and 1.2 V (at the 28 nm technology node and beyond), the method further including: providing first and second active regions of a second transistor, separated by a gate region of the second transistor, on the substrate; and forming a second high-k gate dielectric layer and a $SiO_2$ layer having a thickness of 1 nm to 2 nm in the gate region of the second transistor, the second high-k gate dielectric and $SiO_2$ layers having a combined second breakdown voltage of between 5 V and 10 V.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2, 3A, and 4A illustrate a gate first process for forming a transistor with a high-k gate-dielectric as a built-in e-fuse, in accordance with an exemplary embodiment;

FIGS. 2, 3B, and 4B illustrate a gate last process for forming a transistor with a high-k gate-dielectric as a built-in e-fuse, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of large OTP cell size, high programming voltage/current, and complex fabrication methods having an extra mask step and using a large charge pump to program attendant upon using conventional e-fuses. The problems are solved, for instance, by utilizing a MOS transistor as an OTP cell with high-k gate-dielectric and minimum interfacial oxide layer as a built-in e-fuse element with low programming voltage to blow the e-fuse. The MOS transistor also serves as the "select" transistor of the built-in e-fuse element, it also serves as the "read" device with current amplification capability by the parasitic bipolar structure (drain/active region/source).

Methodology in accordance with embodiments of the present disclosure includes: providing first and second active regions of a transistor, separated by a gate region of the transistor, on a substrate; forming an interfacial layer on the gate region; minimizing the interfacial layer; forming a high-k gate dielectric layer on the interfacial layer to operate as an e-fuse element, the high-k gate dielectric layer and interfacial layer having a combined breakdown voltage less than three times an operating voltage associated with the transistor; and forming a metal gate on the high-k gate dielectric layer.

Figures 1A, 1B:
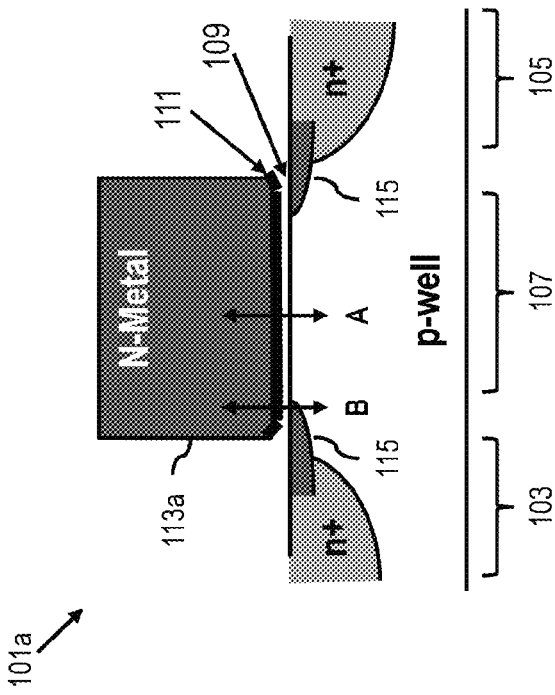
FIGS. 1A and 1B illustrate a NMOS and a PMOS transistor with a high-k gate-dielectric as a built-in e-fuse, respectively, in accordance with exemplary embodiments.

FIGS. 1A and 1B illustrate a NMOS and PMOS transistor (designed for OTP cells) with a high-k gate-dielectric as a built-in e-fuse, respectively (compatible with advanced CMOS node at 28 nm and beyond). FIGS. 1A and 1B respectively include a substrate 100a and 100b having a transistor 101a and 101b, each with first and second active regions 103 and 105 separated by a gate region 107. The gate region 107 includes an interfacial layer 109 and a high-k dielectric layer 111 on the interfacial layer 109. A high-k dielectric has a dielectric constant value greater than 3.9, greater than 10

(e.g., HfO$_2$ based), etc. Nitrogen may be implanted on the surface of the gate region 107 (for reducing the thickness of interfacial oxide layer 109). As shown, the interfacial layer 109 includes SiO$_2$ and has a thickness of less than 0.5 nm, and the high-k dielectric layer 111 includes HfO$_2$ and has a thickness of between 1.5 nm and 2.5 nm (e.g., 2 nm). Moreover, the transistors 101a and 101b are designated to be operated as the new OTP cell of n-type and p-type, respectively. The programming (breakdown) of the gate-dielectric e-fuse is controlled by applying a programming voltage (Vpp) of three times a circuit operating voltage (e.g., Vcc). The combined breakdown voltage of the thin interfacial layer 109 and high-k dielectric layer 111 is designed to be less than three times a circuit operating voltage (e.g., Vcc), for instance, about 2.5 V. After programming, the OTP cell is "read" by applying typical Vcc (1.2-1.5v) of logic circuits between the drain and source and measure the drain current. It is noted that path A includes a "built-in" field providing an additional ½ band-gap (e.g., 0.5 V) thereby causing a programming current to flow on path A rather than B. In turn, during the read operation, the current from the gate also flows through path A into the "base" (or channel) of the parasitic bipolar structure (drain/active-region/source) and trigger amplification of the "base" current.

Adverting to FIG. 1A, first and second active regions 103 and 105, respectively, of the substrate 100a are "n+" type (e.g., larger electron concentration than hole concentration), and the gate region 107 of the substrate 100a includes p-well (e.g., larger hole concentration than electron concentration). Additionally, a metal gate 113a is provided on the high-k dielectric layer 111 and is an n-type metal. The transistor 101a is an n-type MOS transistor used as an n-type OTP cell with built-in e-fuse.

Adverting to FIG. 1B, first and second active regions 103 and 105, respectively, of the substrate 100b are "p+" type (e.g., larger hole concentration than electron concentration), and the gate region 107 of the substrate 100b includes an n-well (e.g., larger electron concentration than hole concentration). Additionally, a metal gate 113b is provided on the high-k dielectric layer 111 and is a p-type metal. The transistor 101b is a p-type MOS transistor used as a p-type OTP cell with built-in e-fuse.

Additionally, an IC may include an array of transistors having a high-k gate-dielectric with minimum interfacial oxide layer configured to operate as an OTP cell with built-in e-fuse (with low enough breakdown voltage for programming the cell representing "1" or "0"). Additionally, IC designs may further include a second type of transistors having a gate-dielectric and thicker interfacial oxide layer configured to operate for logic circuits (with high reliability). The second transistor for logic circuits are formed similarly to the transistors 101a and 101b but with an interfacial layer (e.g., 109) having a thickness of between 1 nm and 2 nm (e.g., 1.5 nm) and having a breakdown voltage of between 5 V and 10 V (e.g., 8 V). Thus, manufacturing processes for fabricating both types of transistor may be used to concurrently generate transistors 101a and 101b for optimized circuit performance.

It is noted that the various examples referring to MOS transistors may apply generally to transistors and that the various examples referring to OTP may also refer generally to multiple-time-programming (MTP).

Figure 2:
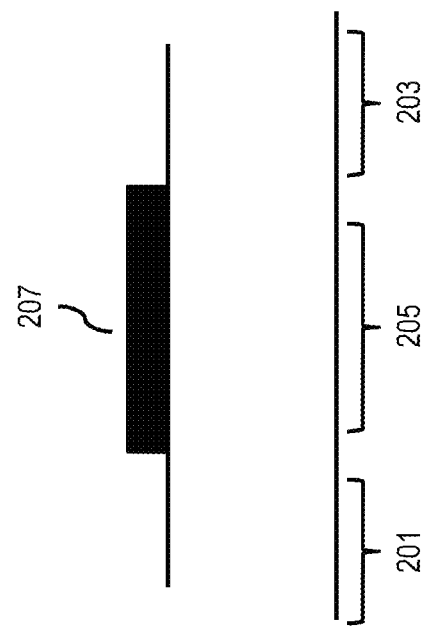
Figure 3B:
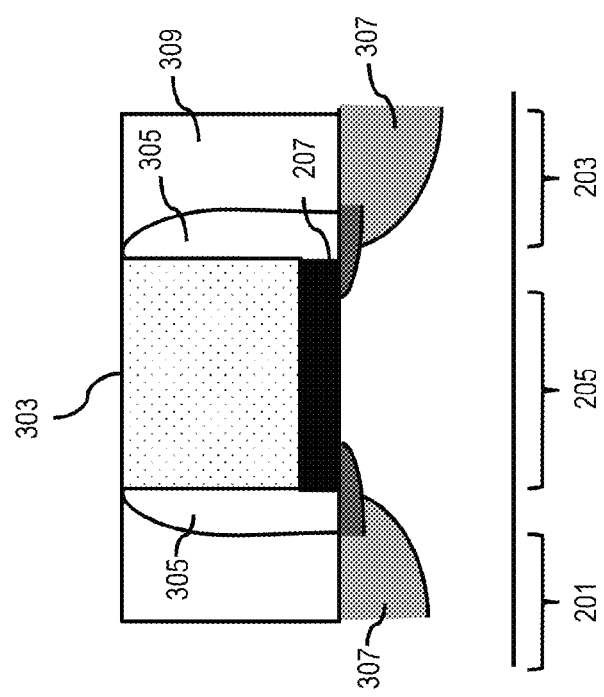
Figure 4A:
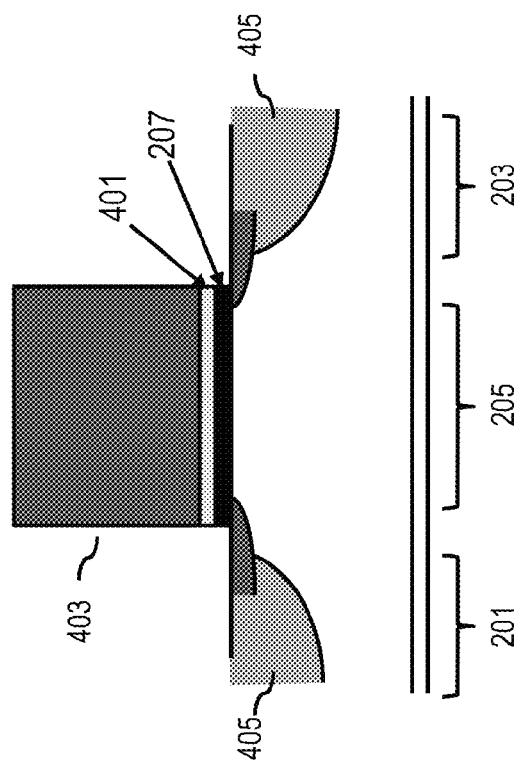
Figure 4B:
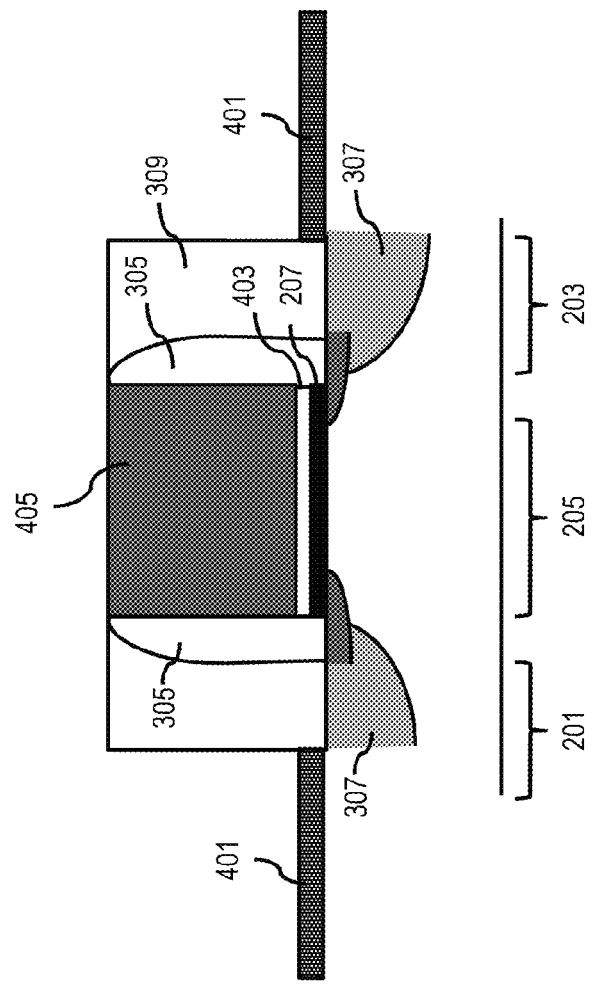

FIGS. 2, 3A, and 4A illustrate a gate first process for forming a transistor with a high-k gate-dielectric as a built-in e-fuse and FIGS. 2, 3B, and 4B illustrate a gate last process for forming a transistor with a high-k gate-dielectric as a built-in e-fuse, in accordance with exemplary embodiments.

The process begins with conventional planar CMOS process steps of depositing and patterning a hard mask on a silicon substrate 200, etching the silicon to form shallow trench isolation (STI) regions, filling the STI regions with oxygen, performing chemical mechanical polishing (CMP), annealing, removing the hard mask, n/p well patterning and implantation in gate regions 205 between areas 201 and 203 (which will later become source/drain regions), and annealing again (not shown for illustrative convenience). Next, adverting to FIG. 2, interfacial layer 207 (e.g., SiO$_2$) is formed on the gate region 205 of the substrate 200, for instance, by exposure of the substrate 200 to oxygen, having a thickness of 1 nm to 2 nm (e.g., 1.5 nm).

Adverting to FIG. 3A, masks 301 are provided to expose portions of the substrate 200, for instance portions of transistors having a gate-dielectric configured to operate as e-fuse and the interfacial layer 207 is minimized (e.g., etched) to a thickness of less than 0.5 nm. The interfacial layer 207 may be reduced by, for instance, implanting N in the gate region 205 of the substrate 200 and/or an interface of the interfacial layer 207 to the substrate 200 prior to and/or after doping the active regions 201 and 203. Additionally, or alternatively, the interfacial layer 207 may be reduced by scavenging oxygen (O) from the interfacial layer 207, for instance, by dry etching (using hydrogen fluoride (HF) or SiCoNi).

Adverting to FIG. 4A, a high-k dielectric layer 401 and metal gate electrode 403 (which may include a work function metal) are formed and patterned on the gate region 205 of the substrate 200. As shown, the high-k dielectric layer 401 is formed of HfO$_2$ and to a thickness of between 1.5 nm and 2.5 nm (e.g., 2 nm). The thickness of the interfacial layer 207 and the high-k dielectric layer 401 may configured to result in a combined breakdown voltage less than three times a circuit operating voltage (e.g., Vcc), for instance, about 2.5 V for a transistor configured to operate as an OTP with built-in e-fuse. Spacers (not shown for illustrative convenience) are formed on opposite sides of metal gate electrode 403, and substrate 200 is doped to form source/drain regions 405 in active regions 201 and 203. As noted above, the active regions 201 and 203 may be doped, for instance, to n+ or p+ type depending on a type of transistor (e.g., NMOS or PMOS). Alternatively, silicon germanium (SiGe) or epitaxial silicon may be grown for raised p-type or n-type source/drain regions, respectively. The process then continues with conventional silicide and contact formation. For example, nickel may be deposited, nickel silicide (NiSi) formed after anneal steps, and interlayer dielectric (ILD) formed, and contacts patterned and filled with tungsten.

Alternatively, as shown in FIGS. 3B and 4B, a replacement gate process may be performed after forming the initial interfacial layer 207 (and prior to reducing the interfacial layer 207). Such a replacement gate process may allow for high temperature processes (such as an annealing step) prior to forming a metal gate. As illustrated in FIG. 3B, a dummy gate 303 is formed on the interfacial layer 207, and spacers 305 are formed around the dummy gate. Source/drain regions 307 are formed by doping, for instance, to n+ or p+ type depending on a type of transistor (e.g., NMOS or PMOS). Alternatively, silicon germanium (SiGe) or epitaxial silicon may be grown for raised p-type or n-type source/drain regions, respectively. An ILD 309 is formed around the spacers and CMP is performed.

Adverting to FIG. 4B, dummy gate 303 is removed, forming a cavity between spacers 305. Masks 401 are provided to expose portions of the substrate 200, for instance portions of transistors having a gate-dielectric configured to operate as an e-fuse, and the interfacial layer 207 is minimized (e.g., stripped and re-grown) to a thickness of less than 0.5 nm. The interfacial layer 207 may be reduced by, for instance, implanting N in the gate region 205 of the substrate 200 and/or an interface of the interfacial layer 207 to the substrate 200 prior to and/or after doping the active regions 201 and 203. Additionally, or alternatively, the interfacial layer 207 may be reduced by scavenging oxygen (O) from the interfacial layer 207, for instance, by dry etching (using hydrogen fluoride (HF) or SiCoNi). The masks 401 may then be removed.

Next, a high-k dielectric layer 403 and metal gate electrode 405 (which may include a work function metal) are formed and patterned on the gate region 205 of the substrate 200. As shown, the high-k dielectric layer 403 is formed of $HfO_2$ and to a thickness of between 1.5 nm and 2.5 nm (e.g., 2 nm). The thickness of the interfacial layer 207 and the high-k dielectric layer 403 may be configured to result in a combined breakdown voltage of less than three times a circuit operating voltage (e.g., Vcc), for instance, about 2.5 V, for a transistor configured to operate as OTP with built-in e-fuse. The ILD 309 may be removed, and the process may continue with conventional silicide and contact formation. For example, nickel may be deposited, nickel silicide (NiSi) formed after annealing steps, and interlayer dielectric (ILD) formed, and contacts patterned and filled with tungsten.

Figure 5:
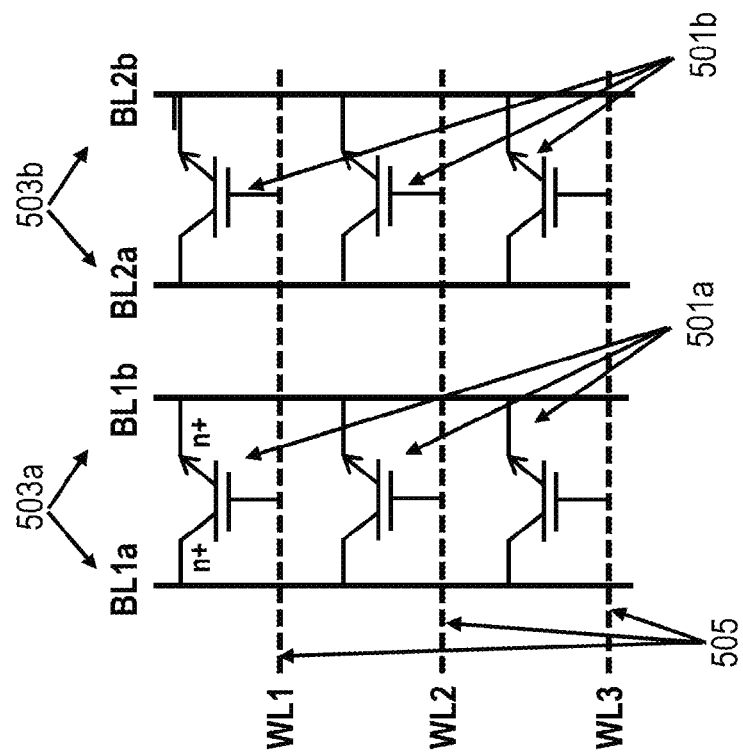
FIG. 5 illustrates programming and reading operations of an array of transistors having a high-k gate-dielectric as a built-in e-fuse, according to an exemplary embodiment.

FIG. 5 is an OTP array 500 of transistors (n-type for illustration) having a gate-dielectric as a built-in e-fuse, according to an exemplary embodiment. FIG. 5 includes transistors 501a and 501b having a gate-dielectric configured to operate as a built-in e-fuse, for instance, transistor 101a of FIGS. 1A and/or a transistor formed using the steps illustrated in FIGS. 2 through 4A or 2 through 4B. As shown, dual bit-lines (BL) 503a and 503b connect active regions (e.g., source and drain) of transistors 501a and 501b, respectively. Moreover, wordlines (WLs) 505 each connect to a gate of one of the OTP cells or transistors 501a and one of the transistors 501b. Note that an OTP cell is "programmed", for instance, when a "breakdown" of the gate dielectric is sufficient to provide a low resistive path to the active region, resulting in the gate having electrical contact to the "base" of a parasitic bipolar structure (drain/active-region/source) of the transistor.

Programming of selected transistors of array 500 may be performed by biasing WLs 505 and BLs 503 to +Vpp/2 and −Vpp/2, respectively, where the full Vpp is across the gate electrode and well or substrate in order to trigger the "breakdown" of the gate-dielectric and interfacial layers (e.g. to blow the e-fuse). Such a programming action allows a programming current to flow through a high-k dielectric layer of the selected transistors that is sufficient enough to enable a current to flow between a gate region of the substrate and a metal gate electrode of the selected transistors. Additionally, unselected transistors of array 500 may have a bias of Vpp/2 across the stack. Thus, the high-k dielectric layer of transistors 501 may be configured to break down at a voltage of less than three times a circuit operating voltage (e.g., Vcc), then the programming voltage (e.g., Vpp) can be set as three times of the circuit operating voltage (e.g., Vcc). Such an OTP with built-in e-fuse, may allow use of smaller charge pumps (and thus saving Si areas) than that for conventional e-fuse programming operation. Programming operations are presented in Table 1, wherein Vpp refers to an operation voltage (e.g., 2.5 V) with logic operation voltage Vcc of ~1v, SC refers to a selected column (e.g., BL 503), UC refers to an unselected column, SR refers to a selected row (e.g., WL 505), and UR refers to an unselected row.

TABLE 1

PROGRAMMING OPERATIONS

|       | BLa     | BLb     | WL      | PROGRAM |
|-------|---------|---------|---------|---------|
| SC/SR | −Vpp/2  | −Vpp/2  | +Vpp/2  | YES     |
| SC/UR | −Vpp/2  | −Vpp/2  | 0       | NO      |
| UC/SR | 0       | 0       | +Vpp/2  | NO      |
| UC/UR | 0       | 0       | 0       | NO      |

Reading of transistors 501 may be performed by positively biasing a WL 505 to initiate an electric current flowing into bases and detecting bipolar current through a source/drain. Unprogrammed transistors may have negligible electric current flowing into the "bases" of the parasitic bipolar structure and therefore negligible bipolar current through a source/drain. "Programmed" transistors have larger currents flowing into the "bases" of the parasitic bipolar structure and further amplified by the bipolar action and resulting in a lager drain current. It is noted that a bias of BL 503 may be reversed due to a symmetrical structure of the active regions of the transistors 501. Reading operations are presented in Table 2, wherein Vd refers to a "read" voltage for OTP array and can be the same as the Vcc for logic circuits (e.g., 1 V to 1.2v for the 28 nm technology node).

TABLE 2

READING OPERATIONS

|       | BLa    | BLb | WL     | READ |
|-------|--------|-----|--------|------|
| SC/SR | +Vd/2  | 0   | +Vd/2  | YES  |
| SC/UR | +Vd/2  | 0   | 0      | NO   |
| UC/SR | 0      | 0   | +Vd/2  | NO   |
| UC/UR | 0      | 0   | 0      | NO   |

It is noted a p-type OTP array may be similarly organized as the n-type array described in Tables 1 and 2 and illustrated in FIG. 5 with a proper reversing of the voltage polarity for read and program operations.

The embodiments of the present disclosure achieve several technical effects, including a built-in e-fuse for one-time (OTP) or multiple-time programming (MTP), which uses minimal Si area, requires a low programming voltage (Vpp), and is compatible with CMOS processing. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing first and second active regions of a transistor, separated by a gate region of the transistor, on a substrate;
forming an interfacial layer on the gate region;
minimizing the interfacial layer;
forming a high-k gate dielectric layer on the interfacial layer to operate as an e-fuse element, the high-k gate dielectric layer and interfacial layer having a combined breakdown voltage less than three times a circuit operating voltage associated with the transistor; and
forming a metal gate on the high-k gate dielectric layer.

2. The method according to claim 1, comprising:
minimizing the interfacial layer by removing, prior to forming the high-k gate dielectric layer, at least a portion of the interfacial layer.

3. The method according to claim 2, comprising:
minimizing the interfacial layer to a thickness of less than 0.5 nanometers (nm).

4. The method according to claim 1, comprising:
minimizing the interfacial layer by implanting nitrogen (N) in the gate region of the substrate.

5. The method according to claim 1, comprising:
forming the high-k gate dielectric layer of hafnium oxide ($HfO_2$) and to a thickness of between 1.5 nm and 2.5 nm.

6. The method according to claim 1, further comprising:
forming a dummy gate;
forming spacers around the dummy gate;
forming an interlayer dielectric (ILD) around the spacers; and
removing the dummy gate, prior to minimizing the interfacial layer.

7. The method according to claim 1, further comprising:
initiating a programming operation in the high-k gate dielectric layer by selectively providing a programming voltage across the gate and first active regions and the gate and second active regions; and
terminating the programming voltage after sufficient breakdown of the high-k gate dielectric layer, wherein sufficient breakdown of the high-k gate dielectric enables a low resistive path between the gate region of the substrate and the metal gate.

8. The method according to claim 7, further comprising:
determining whether the transistor is programmed by providing a reading voltage on the gate and across the first and second active regions, the reading voltage being less than the circuit operating voltage.

9. The method according to claim 1, comprising:
providing first and second active regions of a second transistor, separated by a gate region of the second transistor, on the substrate; and
forming a second high-k gate dielectric layer and a second interfacial layer in the gate region of the second transistor, the second high-k gate dielectric and the second interfacial layers having a combined breakdown voltage greater than three times the combined breakdown voltage of the first transistor.

10. A device comprising:
a substrate;
first and second active regions of a transistor, separated by a gate region of the transistor, on the substrate;
an interfacial layer on the gate region having a thickness of less than 0.5 nanometers (nm);
a high-k gate dielectric layer on the interfacial layer configured to operate as an e-fuse element, the high-k gate dielectric layer and interfacial layers having a combined breakdown voltage less than three times a circuit operating voltage associated with the transistor; and
a metal gate on the high-k gate dielectric layer.

11. The device according to claim 10, wherein:
the interfacial layer comprises silicon dioxide ($SiO_2$).

12. The device according to claim 10, further comprising:
nitrogen (N) implanted in the gate region of the substrate.

13. The device according to claim 10, wherein:
the high-k gate dielectric layer comprises hafnium oxide ($HfO_2$).

14. The device according to claim 13, wherein:
the high-k gate dielectric layer has a thickness of between 1.5 nm and 2.5 nm.

15. The device according to claim 10, wherein:
the breakdown voltage is greater than two times the circuit operating voltage; and
the circuit operating voltage is between 1 V and 1.2 V.

16. The device according to claim 10, further comprising:
first and second active regions of a second transistor, separated by a gate region of the second transistor, on the substrate; and
a second high-k gate dielectric layer and a second interfacial layer in the gate region of the second transistor, the second high-k gate dielectric and the second interfacial layers having a combined breakdown voltage greater than the combined breakdown voltage of the first transistor.

17. The device according to claim 16, further comprising:
the second high-k gate dielectric layer having a breakdown voltage between 5 V and 10 V and comprising a $SiO_2$ interfacial layer having a thickness of between 1 nm and 2 nm.

18. A method comprising:
providing first and second active regions of a transistor, separated by a gate region of the transistor, on a substrate;
forming a silicon dioxide ($SiO_2$) layer having a thickness of greater than 0.5 nanometers (nm) on the gate region;
forming a dummy gate on the $SiO_2$ layer;
forming spacers around the dummy gate;
forming an interlayer dielectric (ILD) around the spacers;
removing the dummy gate, exposing the $SiO_2$ layer;
reducing the $SiO_2$ layer to a thickness of less than 0.5 nm;
implanting nitrogen (N) in the gate region of the substrate;
forming a high-k gate dielectric layer on the reduced $SiO_2$ layer to operate as an e-fuse element, the high-k gate dielectric layer comprising hafnium oxide ($HfO_2$) and having a thickness of between 1.5 nm and 2 nm, wherein the high-k gate dielectric layer and $SiO_2$ layer have a combined breakdown voltage of less than three times a circuit operating voltage associated with the transistor; and
forming a metal gate on the high-k gate dielectric layer.

19. The method according to claim 18, comprising:
initiating a programming operation in the high-k gate dielectric layer by selectively providing a programming voltage across the gate and first active regions and the gate and second active regions;
terminating the programming voltage after sufficient breakdown of the high-k gate dielectric layer, wherein sufficient breakdown of the high-k gate dielectric enables a low resistive path between the gate region of the substrate and the metal gate; and
determining whether the transistor is programmed by providing a reading voltage on the gate and across the first and second active regions, the reading voltage being less than the circuit operating voltage.

20. The method according to claim 18, wherein the first breakdown voltage is 2.5 volts (V) and the circuit operating voltage is between 1 V and 1.2 V, the method further comprising:
- providing first and second active regions of a second transistor, separated by a gate region of the second transistor, on the substrate; and
- forming a second high-k gate dielectric layer and a $SiO_2$ layer having a thickness of 1 nm to 2 nm in the gate region of the second transistor, the second high-k gate dielectric and $SiO_2$ layers having a combined second breakdown voltage of between 5 V and 10 V.

* * * * *